United States Patent [19]
Hofmann

[11] Patent Number: 6,104,252
[45] Date of Patent: Aug. 15, 2000

[54] CIRCUIT FOR AUTOMATIC FREQUENCY CONTROL USING A RECIPROCAL DIRECT DIGITAL SYNTHESIS

[75] Inventor: Ludwig Hofmann, Ilmmünster, Germany

[73] Assignee: Siemens Aktiengesellschaft, Munich, Germany

[21] Appl. No.: 09/414,684

[22] Filed: Oct. 7, 1999

Related U.S. Application Data

[63] Continuation of application No. PCT/DE98/00436, Feb. 13, 1998.

[30] Foreign Application Priority Data

Apr. 7, 1997 [DE] Germany .......................... 197 14 290

[51] Int. Cl.⁷ .............................. H03L 1/02; H03L 7/099; H03L 7/18
[52] U.S. Cl. ........................... 331/16; 327/105; 327/106; 331/18; 331/25; 331/34; 331/176
[58] Field of Search .................................. 331/16, 18, 25, 331/34, 176; 327/105, 106

[56] References Cited

U.S. PATENT DOCUMENTS

| | | | |
|---|---|---|---|
| 4,454,483 | 6/1984 | Baylor | 331/11 |
| 4,849,993 | 7/1989 | Johnson et al. | 331/1 A |
| 4,965,533 | 10/1990 | Gilmore | 331/18 |
| 5,028,887 | 7/1991 | Gilmore | 331/18 |
| 5,216,389 | 6/1993 | Carralero et al. | 331/18 |
| 5,539,346 | 7/1996 | Goto | 327/156 |

FOREIGN PATENT DOCUMENTS

| | | |
|---|---|---|
| 0595013A2 | 5/1994 | European Pat. Off. . |
| 0599609A1 | 6/1994 | European Pat. Off. . |
| 4320087C1 | 8/1994 | Germany . |
| 03005966 | 1/1991 | Japan . |
| 2132042 | 6/1984 | United Kingdom . |

*Primary Examiner*—Siegfried H. Grimm
*Attorney, Agent, or Firm*—Herbert L. Lerner; Laurence A. Greenberg; Werner H. Stemer

[57] ABSTRACT

A circuit for automatic frequency control includes an oscillator and a digital synthesis device to which a first frequency of the oscillator is supplied as a clock frequency and which generates an output signal having a second frequency. A frequency comparison device determines a frequency difference between the second frequency and a reference frequency and generates a digital output signal reproducing the frequency difference. The digital output signal is then supplied as an addition value to the digital synthesis device. The circuit for automatic frequency control generates a highly accurate and temperature-compensated output signal with the second frequency.

5 Claims, 5 Drawing Sheets

CIRCUIT FOR AUTOMATIC FREQUENCY CONTROL USING A RECIPROCAL DIRECT DIGITAL SYNTHESIS

CROSS-REFERENCE TO RELATED APPLICATION

This application is a continuation of copending International Application No. PCT/DE98/00436, filed Feb. 13, 1998, which designated the United States.

BACKGROUND OF THE INVENTION

Field of the Invention

The invention relates to a circuit for automatic frequency control (AFC).

In many devices it is necessary to perform an automatic frequency control. The relevant field of use is the electronic tuning of the frequency of oscillator circuits. In this electronic tuning, for example, so-called capacitance diodes are used. In operation, capacitance diodes need a direct voltage of 10 volts to 30 volts which must be constant to a few millivolts. In the case of receivers with battery supply, they can therefore only be used in conjunction with a DC—DC converter. The temperature-dependence of the junction capacitance is a great disadvantage of the capacitance diodes. A diode having the same temperature coefficient is therefore often connected as a temperature-dependent resistor into the feed line of the supply voltage.

In the case of large RF voltages, the curved characteristic of the capacitance diode produces a shift of the mean value of the direct voltage, and thus a change in capacitance. This can lead to distortions. These changes in capacitance can be compensated for through the use of two equal back-to-back connected diodes. The voltage dependence and temperature dependence of the capacitance diodes is effective mainly at high frequencies. Even small changes in capacitance lead to considerable frequency changes at these frequencies. The consequence is a distorted reception of the transmitter tuned in. This is why an automatic frequency control is required, for example, in the case of a diode tuning. Here, the controlled variable is the frequency of the oscillator. Using the automatic frequency control (AFC), the tuning is thus kept stable by controlling the oscillator frequency.

A customary AFT circuit is shown in FIG. 9. In this case, a temperature-compensated voltage-controlled oscillator (VCO) delivers a signal having a particular clock rate to a frequency comparison device 3. This frequency comparison device 3 compares the clock frequency of the temperature-compensated voltage-controlled oscillator (VCO) 9 with a system clock frequency $f_{ref}$ which is obtained, for example, from a time standard information. The frequency comparison device 3 outputs a digital tracking signal which reproduces or represents the frequency difference between the clock frequency of the VCO 9 and the system clock frequency $f_{ref}$, wherein the frequency difference is determined in the frequency comparison device 3. This digital tracking signal is supplied to a digital/analog (D/A) converter 10 which converts it into an analog tracking signal. This analog tracking signal is supplied to the temperature-compensated VCO 9 for controlling its oscillator frequency, which closes the control loop.

As can be seen from FIG. 9, the control loop is thus implemented in an analog manner. This analog implementation, however, results in a number of disadvantages. For example, interference is easily coupled in. There are also problems with respect to the dynamic range needed. This plays a significant role especially in the case of devices in which reduced supply voltages are present such as is the case, for example, in mobile telephones. A further disadvantage is that the constructional expenditure with respect to the D/A converter 10 for tracking the analog tuning voltage is very high since the accuracy of the digital/analog converter 10 is decisive for the precision of the control. Further disadvantages also to be mentioned are that the AFC circuit constructed as shown in FIG. 9 responds only slowly and can not be easily integrated into an integrated circuit due to the analog tracking.

Furthermore, the document Patent Abstracts of Japan, Vol. 15, No. 116 (P-1182), Mar. 20, 1991 and the Japanese patent publication JP 03005966 A (Matsushita Electric Ind Co Ltd) disclose a circuit for an automatic frequency control which permits a simple and precise tracking of an oscillator frequency.

SUMMARY OF THE INVENTION

It is accordingly an object of the invention to provide a circuit for automatic frequency control which overcomes the above-mentioned disadvantages of the heretofore-known circuits of this general type and which is based on the principle of a reciprocal DDS (direct digital synthesis) and has an improved stability during operation.

With the foregoing and other objects in view there is provided, in accordance with the invention, a circuit for automatic frequency control, including:

an oscillator oscillating at a first frequency;

a digital synthesis device connected to the oscillator, the digital synthesis device receiving the first frequency as a clock frequency and generating an output signal having a second frequency; and a frequency comparison device connected to the digital synthesis device and having a table for storing a temperature characteristic of the oscillator, the frequency comparison device determining a frequency difference between the second frequency and a reference frequency, generating a digital output signal reproducing the frequency difference, and supplying the digital output signal as an addition value to the digital synthesis device, the frequency comparison device further receiving temperature information for a temperature compensation of the digital output signal.

With the objects of the invention in view there is also provided, a circuit for automatic frequency control, including:

an oscillator oscillating at a first frequency and a first phase;

a digital synthesis device generating an output signal having a second frequency and a second phase;

a phase comparator connected to the oscillator and to the digital synthesis device, the phase comparator comparing the first phase with the second phase and generating a first analog output signal reproducing a result of the comparison of the first and second phases;

a voltage-controlled oscillator connected to the phase comparator, the voltage-controlled oscillator receiving the first analog output signal as a control signal, generating a second analog output signal having a master clock frequency based on the control signal, and supplying the second analog output signal as a clock frequency to the digital synthesis device; and a frequency comparison device connected to the voltage controlled oscillator for determining a frequency difference between the master clock frequency and a reference frequency and generating a digital output signal reproducing the frequency difference, and supplying the digital output signal as an addition value to the digital synthesis device.

The central concept of the invention is that the frequency comparison device has a table in which the temperature characteristic of the oscillator is stored, and that temperature information can be supplied to the frequency comparison device for a temperature compensation of the output signal.

An oscillator which oscillates at a frequency $f_{xtal}$ is provided in the circuit according to the invention. This frequency $f_{xtal}$ of the oscillator is supplied to a direct digital synthesis device as a clock frequency. A frequency comparison device, which determines a difference between the output frequency $f_{mut}$ of the digital synthesis device and a reference frequency $f_{ref}$, is also provided. The frequency comparison device generates a digital output signal, which represents the frequency difference determined between the output frequency $f_{mut}$ of the digital synthesis device and the reference frequency $f_{ref}$. The digital output signal of the frequency comparison device is then supplied to the digital synthesis device as an addition value, whereby the control loop is closed. As a consequence, there is a digital feedback.

A band-pass filter having a pass frequency $f_{bp}$ can be connected between the digital synthesis device and the frequency comparison device. The pass frequency $f_{bp}$ here essentially corresponds to the time average of the frequency $f_{mut}$ of the output signal of the digital synthesis device. Providing the band-pass filter can improve the spectral purity of the output signal of the digital synthesis device.

According to another aspect of the invention, a circuit for automatic frequency control (AFC) is provided which includes an oscillator oscillating at a frequency $f_{xtal}$. Furthermore, a digital synthesis device is provided which generates an output signal having the frequency $f_{out}$. A phase comparator compares the phase of the signal of the oscillator having the frequency $f_{xtal}$ with the phase of the output signal of the digital synthesis device and generates an analog output signal which reproduces the result of the comparison. That is to say, the greater the difference between the phase of the signal of the oscillator and the phase of the output signal of the digital synthesis device, determined by the comparison, the greater the analog output signal of the phase comparator. The analog output signal of the phase comparator is then supplied as a control signal to a voltage-controlled oscillator (VCO). This voltage-controlled oscillator (VCO) generates, in dependence on the control signal, an output signal having a master clock frequency $f_{mut}$. A frequency comparison device determines a difference between the master clock frequency $f_{mut}$ of the output signal of the voltage-controlled oscillator (VCO) and a reference frequency $f_{ref}$. The frequency comparison device generates a digital output signal which reproduces the frequency difference which has been determined. That is to say, the greater the difference between the master clock frequency $f_{mut}$ of the voltage-controlled oscillator and the reference frequency $f_{ref}$, the greater the digital output signal of the frequency comparison device. This digital output signal of the frequency comparison device is then supplied as an addition value to the digital synthesis device. The analog output signal of the voltage-controlled oscillator (VCO) having a master clock frequency $f_{mut}$ is supplied as clock frequency to the digital synthesis device. The voltage-controlled oscillator (VCO) is thus corrected to the master clock frequency $f_{mut}$ in the manner of a phase-locked loop (PLL), in such a manner that the output signal of the digital synthesis device is compared with a non-temperature-compensated oscillator and the tracking is performed by setting the very finely graded (non-integer) control value of the digital synthesis device.

The digital output signal of the frequency comparison device can be temperature-compensated in this case. A frequency divider can be connected between the voltage-controlled oscillator (VCO) and the digital synthesis device. The frequency divider divides the frequency $f_{mut}$ of the output signal of the voltage-controlled oscillator, which is supplied as clock frequency to the digital synthesis device, by a particular value to a frequency $f_{in}$.

Other features which are considered as characteristic for the invention are set forth in the appended claims.

Although the invention is illustrated and described herein as embodied in a digital AFC adjustment device using reciprocal direct digital synthesis, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED
EMBODIMENTS

Figure 5:
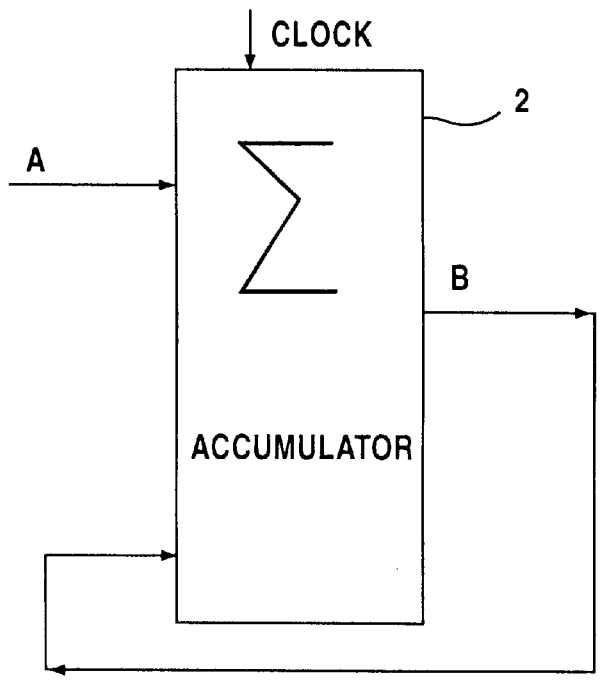
FIG. 5 is a schematic diagram of a digital synthesis device.

Referring now to the figures of the drawings in detail and first, particularly, to FIG. 5 thereof, a so-called digital synthesis device (direct digital synthesis—DDS) will be explained. The digital synthesis device represents a central component of the invention. The digital synthesis device allows a digital signal synthesis. FIG. 5 is a schematic diagram illustrating the principle of the operation of such a digital synthesis device (DDS) 2. The basic function of a DDS is that of an accumulator which adds an input signal A to the output signal B at a particular clock rate. The mathematical function performed by a DDS can thus be represented as follows:

$$B_n = A + B_{(n-1)} \qquad \text{(Equation 1)}$$

If a certain range of numbers, the so-called accumulator range or adding range, is exceeded, the output signal of the digital synthesis device (DDS) drops back to zero or, respectively, to the newly calculated value B=B modulo counting range (overflow addition). The following example will serve as an explanation:

Clock rate=1 MHz

Addition value A=1

Accumulator range (word length, adding range)=1 million

According to the function of equation 1, the output value B increments continuously from 0 to 1 million in this case and then drops back to 0. The output value B then begins to increment again. The result is therefore that a sawtooth having a certain frequency $f_{out}$ is generated. This frequency can be calculated as follows:

$$f_{out} = \frac{\text{clock rate} \times \text{addition value } A}{\text{adding range}} \qquad \text{(Equation 2)}$$

Figure 6:
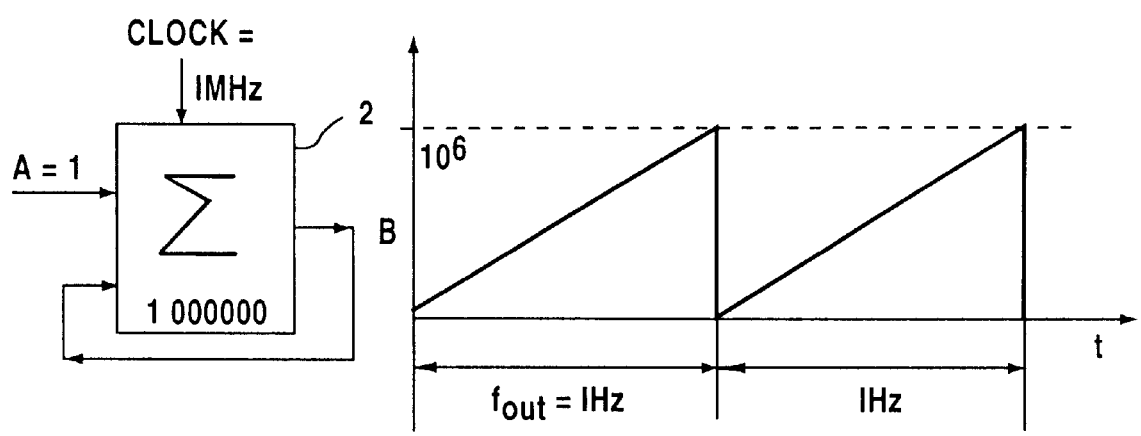
FIG. 6 is a schematic diagram of a digital synthesis device and an illustration for explaining the operation of the digital synthesis device.
Figure 7:
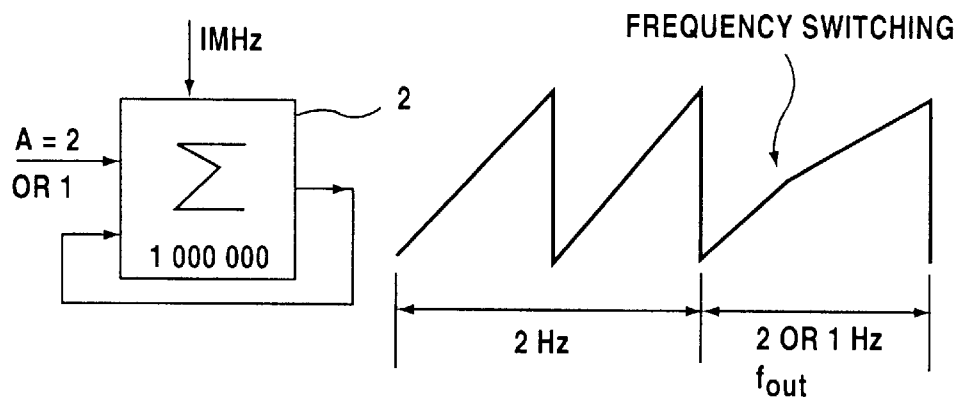
FIG. 7 is a schematic diagram of a digital synthesis device and an illustration for explaining a frequency switching during the operation of the digital synthesis device.

Thus, if the clock rate is 1 MHz, the addition value A=1 and the adding range=1 million, a sawtooth having a repetition rate of 1 Hz is generated in this example, as is shown in FIG. 6. Equation 2 shows in a simple manner that the frequency $f_{out}$, which is generated, directly depends on the clock rate, the addition value A present and the word length of the adder (accumulator). Let us now consider the case where the addition value A is changed, for example, to 2 (see FIG. 7). As can be calculated from equation 2, the frequency $f_{out}$ generated will change from 1 Hz to 2 Hz due to the jump of the addition value from 1 to 2 in this case. Thus, the frequency $f_{out}$ generated is switched. The switching of the output frequency $f_{out}$ of the DDS can in this case take place very rapidly, namely within one clock cycle. Furthermore, the frequency $f_{out}$ is switched without phase shift as can also be seen from FIG. 7.

Figure 8:
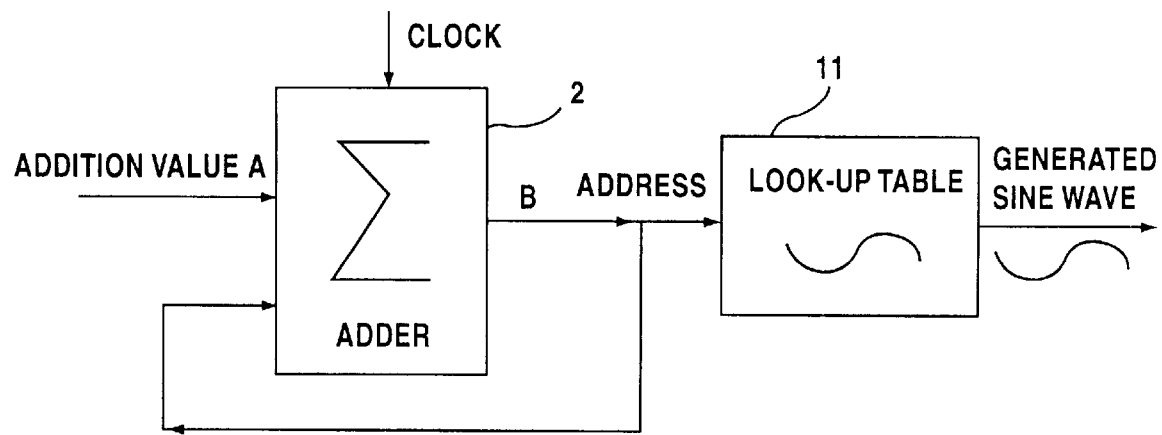
FIG. 8 is a schematic diagram of a digital synthesis device connected to a look-up table for converting a signal generated by the digital synthesis device into a sinusoidal signal.
Figure 9:
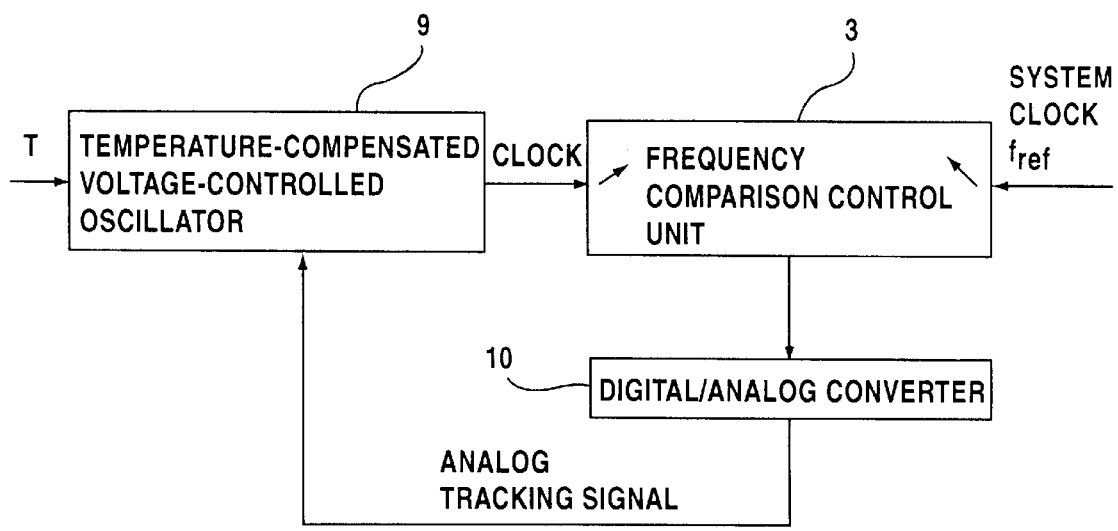
FIG. 9 is a block diagram of a prior art circuit for automatic frequency control.

Normally, a sawtooth-shaped signal is not desired for further processing. As can be seen from FIG. 8, a sinusoidal signal can be obtained from the sawtooth-shaped output signal having the frequency $f_{out}$ of the DDS 2 by supplying the output signal B having the frequency $f_{out}$ of the DDS 2 as an address to a so-called look-up table 11. The sawtooth function is thus converted via a look-up table 11 so that a sinusoidal signal is generated directly from the address information. As can be seen especially from equation 2, it is possible to provide an FM modulation of the generated signal having the frequency $f_{out}$ by changing the addition value A. The maximum frequency $f_{out}$ of the output signal of the DDS 2, which can be generated, is theoretically half the clock frequency of the DDS 2. In practice, however, the maximum frequency should be maximally 30% of the clock frequency of the DDS 2. If the DDS is to be used for an application in the field of mobile communications, it can be produced as an integrated circuit (IC), for example using CMOS technology.

Figure 1:
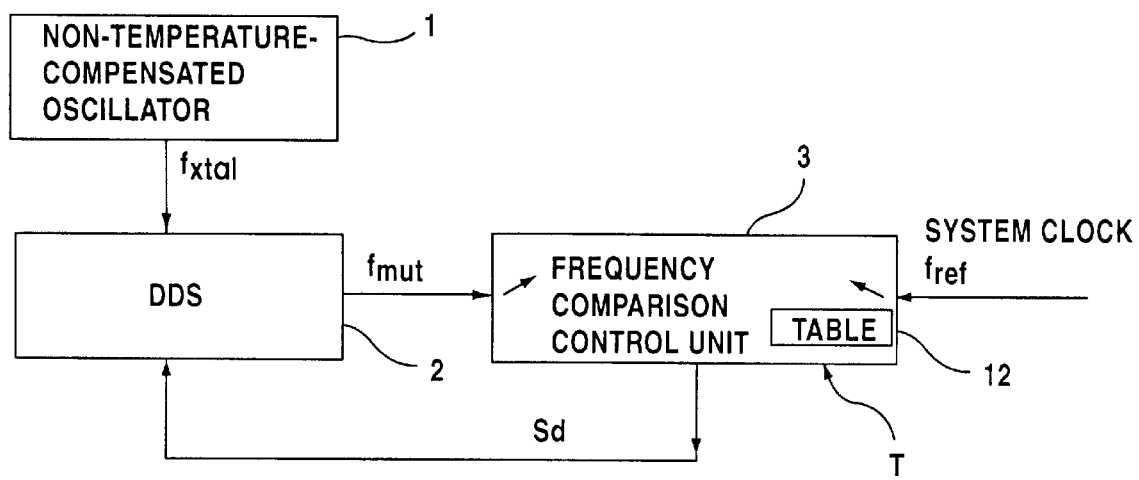
FIG. 1 is a block diagram of a first circuit for automatic frequency control (AFC) according to a first exemplary embodiment of the invention.

After the explanation of the principle of the operation of a digital synthesis device (DDS), a first exemplary embodiment of a circuit according to the invention for automatic frequency control will now be explained. As can be seen from FIG. 1, the output signal of a non-temperature-compensated oscillator 1 having the frequency $f_{xtal}$ is supplied as a clock frequency to a digital synthesis device (DDS) 2. The DDS 2 generates an output signal having the frequency $f_{mut}$ which is supplied as master clock frequency to a frequency comparison device 3. The frequency comparison device 3 compares the frequency $f_{mut}$ of the output signal of the DDS 2 with a reference frequency $f_{ref}$ which, for example, can be obtained from a time standard information in the form of a system clock frequency. However, the reference frequency $f_{ref}$ can also be obtained with a reference oscillator such as, for example, a crystal. The frequency comparison device 3 generates a digital output signal which depends on the determined difference between the frequency $f_{mut}$ of the output signal of the DDS 2 and the reference frequency $f_{ref}$. Normally, the frequency comparison device 3 will be implemented in software. The digital output signal Sd of the frequency comparison device 3 is supplied as addition value to the DDS 2.

In the frequency comparison device 3, a table 12 can be stored which reproduces the characteristic of the temperature-dependence f(T) of the frequency of the non-temperature-compensated oscillator 1. If then temperature information T is supplied to the frequency comparison device 3, this device can temperature-compensate the digital output signal Sd in that it determines from the temperature information T and the stored characteristic of the temperature-dependence of the non-temperature-compensated oscillator 1 the extent to which the digital output signal Sd must be increased or decreased in order to compensate for the temperature-dependence (Drift) of the oscillator 1. Thus, a temperature-compensated signal $f_{mut}$ corrected for a system clock frequency having the frequency $f_{ref}$ is generated with the aid of the DDS 2 and the frequency comparison device 3 acting as a control unit. The temperature-compensated signal $f_{mut}$ is generated from a clock signal, namely the output signal of the non-temperature-compensated oscillator 1 having the frequency $f_{xtal}$ which is neither temperature-compensated nor corrected otherwise.

Figure 2:
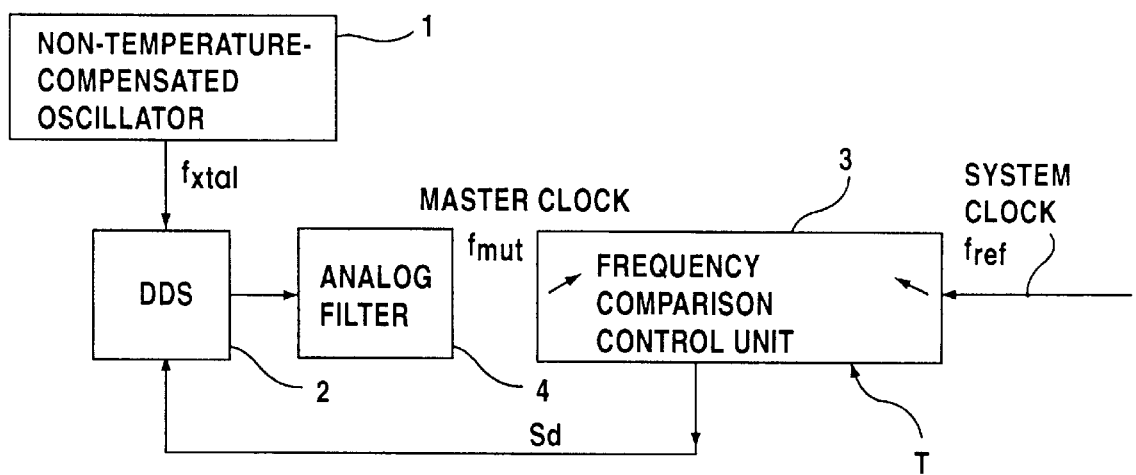
FIG. 2 is a block diagram of a second circuit for automatic frequency control according to the first exemplary embodiment of the invention.

However, it must be taken into consideration that the output signal of the DDS 2 having the frequency $f_{mut}$, which is used as the master clock frequency, is, as a rule, much poorer than a crystal or quartz with respect to its spectral purity. This is due to the fact that the spectral purity is determined by the resolution of the D/A converters in the DDS 2 and that these D/A converters cannot have an arbitrarily high quality. FIG. 2 shows how this disadvantage can be eliminated. As can be seen from FIG. 2, an analog filter 4, which especially improves the far-off spectrum of the output signal of the DDS 2 having the frequency $f_{mut}$, can be connected between the DDS 2 and the frequency comparison device 3. The improvement to the nearby spectrum is less pronounced. The analog filter 4 is a band-pass filter having a pass frequency $f_{bp}$ which is selected in such a manner that it essentially corresponds to the time average of the frequency $f_{mut}$ of the output signal of the DDS 2.

A second exemplary embodiment of a circuit according to the invention for automatic frequency control will now be described with reference to FIG. 3. As can be seen from FIG. 3, the output signal of the non-temperature-compensated oscillator 1 having the frequency $f_{xtal}$ is supplied to a so-called phase comparator 6. The phase comparator 6 compares the phase of the output signal of the non-temperature-compensated oscillator 1 having the frequency $f_{xtal}$ with the phase of the output signal of a DDS 2 having the frequency $f_{out}$. The phase comparator 6 generates an analog output signal (tracking signal) in dependence on the result of the comparison of the phase of the output signal of the non-temperature-compensated oscillator 1 and, respectively, of the DDS 2. This analog tracking signal is supplied to a voltage-controlled oscillator 5 via a low-pass filter 7. The VCO 5 can be constructed, for example, using oscillators tunable by capacitance diodes, stable multivibrators or flip-flops and blocking oscillators. The output signal of the voltage-controlled oscillator 5 having the frequency $f_{in}$ is supplied as clock frequency to the digital synthesis device 2. In addition, the output signal of the voltage-controlled oscillator 5 is supplied as a master clock having the frequency $f_{mut}$ to a frequency comparison device 3. This frequency comparison device 3 compares the frequency $f_{mut}$ of the voltage-controlled oscillator 5 with a reference frequency $f_{ref}$ which, for example, can be obtained as a system clock frequency from a time standard information. As has already been described in the context of the first exemplary embodiment, the frequency comparison device 3 can also include devices for temperature compensation, wherein information on the temperature T is supplied. The frequency comparison device 3 generates a digital tracking signal Sd in dependence on the result of the frequency comparison. This digital tracking signal Sd is supplied as addition value to the DDS 2.

Thus, the voltage-controlled oscillator is corrected to the master clock frequency $f_{mut}$ in the manner of a phase-locked loop (PLL), such that the output signal of the DDS 2 having the frequency $f_{mut}$ is compared with the frequency $f_{xtal}$ of a non-temperature-compensated oscillator. This PLL-like circuit is corrected by adjusting the control value of the DDS 2. In this configuration, the control value can be very finely graded (non-integer). The following equations apply in this case for the DDS 2.

$$\frac{f_{out}}{f_{in}} = \frac{\text{addition value}}{\text{adding range}} \quad \text{(Equation 3)}$$

$$f_{out} = \frac{f_{in} * \text{addition value}}{\text{adding range}} \quad \text{(Equation 4)}$$

In this context, it must be taken into consideration that the frequency $f_{xtal}$ of the non-temperature-compensated oscillator 1 and also the frequency of the output signal of the DDS 2 is very low in comparison with the frequency $f_{in}$ of the voltage-controlled oscillator 5 as can be seen from equation 2, and it must be taken into account that the value of the adding range is much greater than that of the addition value A.

Figure 3:
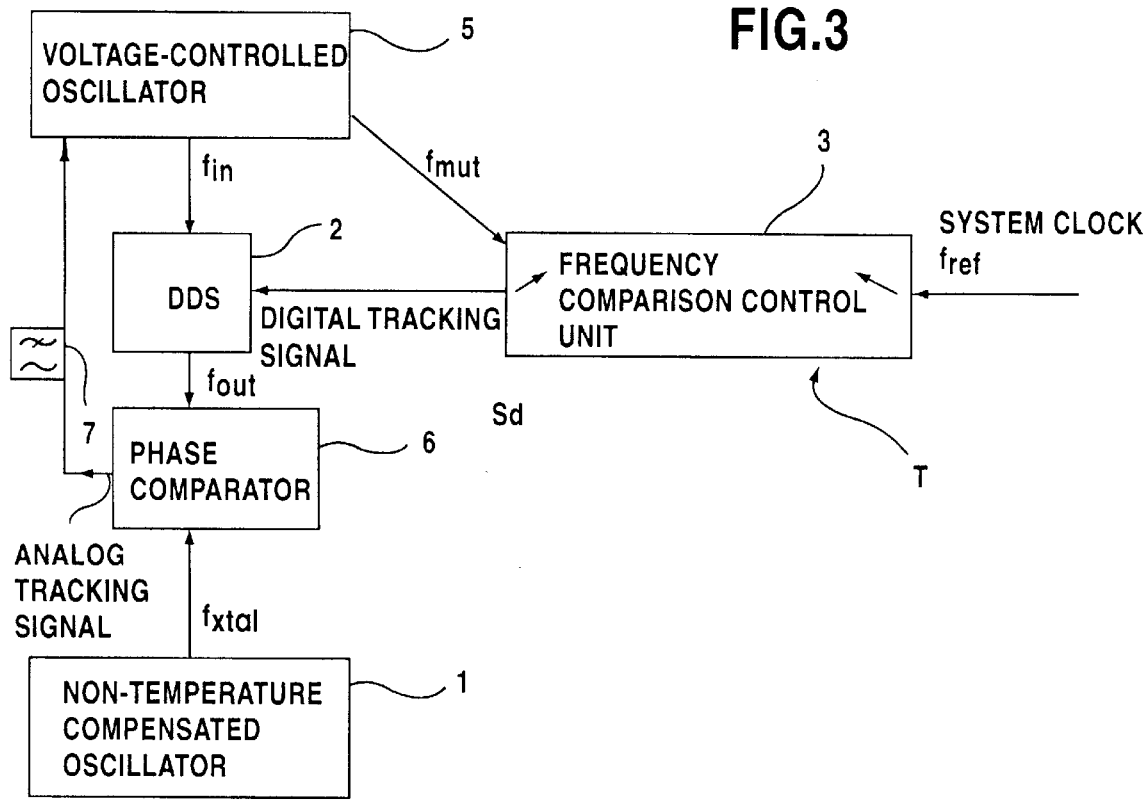
FIG. 3 is a block diagram of a circuit for automatic frequency control according to a second exemplary embodiment of the invention.

In the phase-locked and frequency-locked coupling state of the circuit shown in FIG. 3, the two output frequencies $f_{out}$ and $f_{xtal}$ are of equal value ($f_{out}=f_{xtal}$) and the following holds true in this controlled state:

$$\frac{f_{in}}{f_{xtal}} = \frac{\text{adding range}}{\text{addition value}} \quad \text{(Equation 5)}$$

This equation shows that the master frequency $f_{mut}$ generated can be tied to the non-temperature-compensated oscillator 1 in very finely graded small steps by changing the addition value. Thus, the temperature drift of the non-temperature-compensated oscillator 1 and the frequency offset or frequency error of the control can be controlled by continuously correcting (tracking) the addition value as a control value. Unwanted signals are suppressed by the oscillator 1 itself since the latter has a high quality factor, and by the low-pass filter 7.

Figure 4:
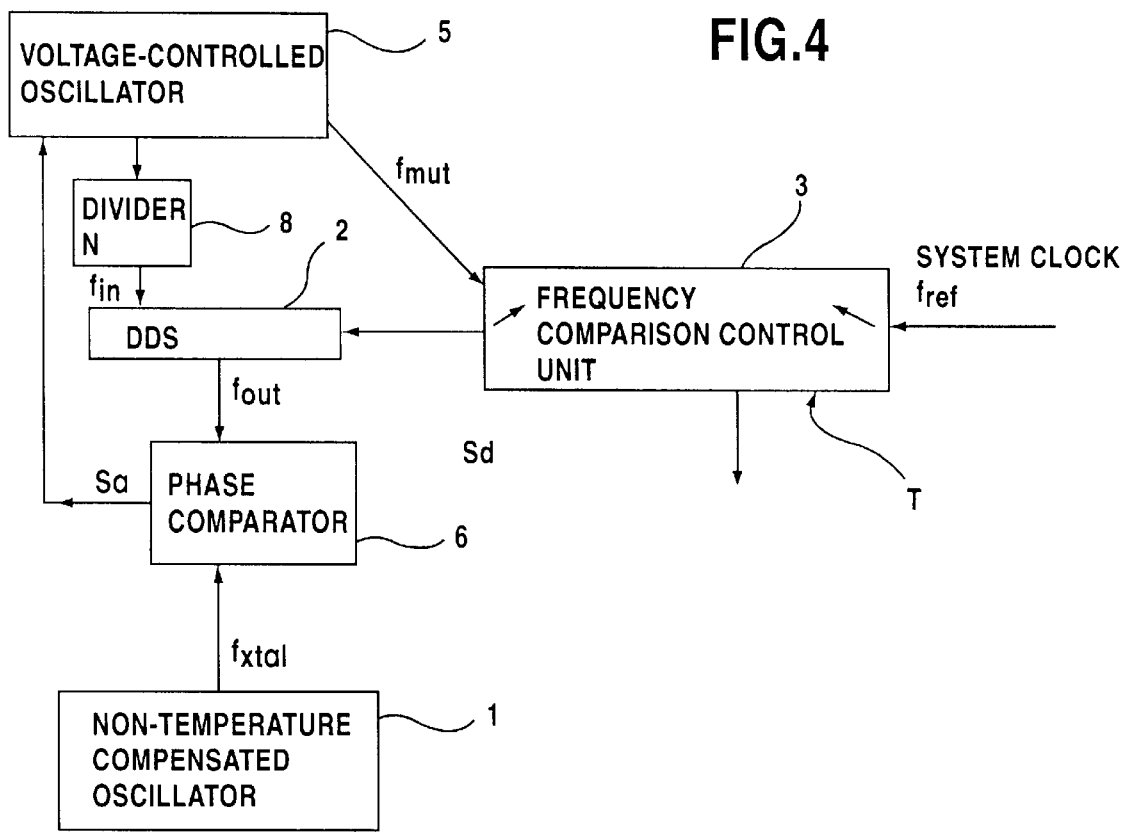
FIG. 4 is a block diagram of a further circuit for automatic frequency control according to the second exemplary embodiment of the invention.

FIG. 4 shows a modification of the circuit for automatic frequency control shown in FIG. 3. This modification is advantageous if it is intended to generate a master clock frequency $f_{mut}$ having a very high frequency. As can be seen from FIG. 4, a frequency divider (prescaler) 8 is connected between the voltage-controlled oscillator 5 and the digital synthesis device 2 for this purpose. This divider 8 divides the frequency of the output signal of the voltage-controlled oscillator 5 by a predetermined value N. This frequency $f_{in}$ divided down by the value N is then supplied as clock frequency to the DDS 2. The DDS 2 can thus run at a low clock frequency in comparison with the master clock frequency $f_{mut}$ which makes it possible to lower the power consumption and the requirements for the DDS. This is especially advantageous in applications such as, for example, in mobile transceivers in which low power consumption has the maximum priority.

The digital tracking and the use of the DDS 2 thus make it possible to generate a signal which is very accurate and temperature-compensated.

I claim:

1. A circuit for automatic frequency control, comprising:
an oscillator oscillating at a first frequency;
a digital synthesis device connected to said oscillator, said digital synthesis device receiving the first frequency as a clock frequency and generating an output signal having a second frequency; and
a frequency comparison device connected to said digital synthesis device and having a table for storing a temperature characteristic of said oscillator, said frequency comparison device determining a frequency difference between the second frequency and a reference frequency, generating a digital output signal reproducing the frequency difference, and supplying the digital output signal as an addition value to said digital synthesis device, said frequency comparison device further receiving temperature information for a temperature compensation of the digital output signal.

2. The circuit according to claim 1, including an analog band-pass filter connected between said digital synthesis device and said frequency comparison device and having a pass frequency substantially corresponding to a time average of the second frequency.

3. A circuit for automatic frequency control, comprising:
an oscillator oscillating at a first frequency and a first phase;
a digital synthesis device generating an output signal having a second frequency and a second phase;
a phase comparator connected to said oscillator and to said digital synthesis device, said phase comparator comparing the first phase with the second phase and generating a first analog output signal reproducing a result of a comparison between the first and second phases;

a voltage-controlled oscillator connected to said phase comparator, said voltage-controlled oscillator receiving the first analog output signal as a control signal, generating a second analog output signal having a master clock frequency based on the control signal, and supplying the second analog output signal as a clock frequency to said digital synthesis device; and a frequency comparison device connected to said voltage controlled oscillator for determining a frequency difference between the master clock frequency and a reference frequency and generating a digital output signal reproducing the frequency difference, and supplying the digital output signal as an addition value to said digital synthesis device.

4. The circuit according to claim 3, wherein said frequency comparison device generates a temperature-compensated digital output signal.

5. The circuit according to claim 3, including a frequency divider connected between said voltage-controlled oscillator and said digital synthesis device for dividing the master clock frequency by a given value.

* * * * *